United States Patent
Tsuda

(10) Patent No.: US 10,151,809 B2
(45) Date of Patent: Dec. 11, 2018

(54) MAGNETIC RESONANCE IMAGING APPARATUS AND OPERATING METHOD

(71) Applicant: HITACHI, LTD., Tokyo (JP)

(72) Inventor: Munetaka Tsuda, Tokyo (JP)

(73) Assignee: HITACHI, LTD., Tokyo (JP)

( * ) Notice: Subject to any disclaimer, the term of this patent is extended or adjusted under 35 U.S.C. 154(b) by 1209 days.

(21) Appl. No.: 14/345,372

(22) PCT Filed: Sep. 24, 2012

(86) PCT No.: PCT/JP2012/074422
§ 371 (c)(1),
(2) Date: Mar. 17, 2014

(87) PCT Pub. No.: WO2013/058062
PCT Pub. Date: Apr. 25, 2013

(65) Prior Publication Data
US 2014/0232402 A1 Aug. 21, 2014

(30) Foreign Application Priority Data
Oct. 21, 2011 (JP) .................................. 2011-232080

(51) Int. Cl.
*G01R 33/38* (2006.01)
*G01R 33/389* (2006.01)
(Continued)

(52) U.S. Cl.
CPC ....... *G01R 33/3804* (2013.01); *G01R 33/389* (2013.01); *G01R 33/3815* (2013.01); *G01R 33/3875* (2013.01)

(58) Field of Classification Search
CPC ............ G01R 33/3815; G01R 33/3804; G01R 33/3875; G01R 33/389; H01F 6/04
See application file for complete search history.

(56) References Cited

U.S. PATENT DOCUMENTS

| 5,936,499 A | 8/1999 | Eckels |
| 2007/0204630 A1* | 9/2007 | Tsuda ................. G01R 33/3815 62/47.1 |

(Continued)

FOREIGN PATENT DOCUMENTS

| CN | 101413746 | 4/2009 |
| EP | 0937995 A2 | 8/1999 |

(Continued)

OTHER PUBLICATIONS

International Search Report in PCT/JP2012/074422.
Chinese official action dated May 27, 2015 in corresponding Chinese Patent Application No. 2015052201189310.

*Primary Examiner* — Rishi R Patel
(74) *Attorney, Agent, or Firm* — Cooper & Dunham LLP

(57) ABSTRACT

In order to extend the lifetime of a cooler and reduce down periods of an MRI apparatus due to the maintenance, a cooling capacity of the cooler 107 of the superconducting magnet is controlled so that cooling heat absorption almost equivalent to an amount of heat penetrating into the refrigerant vessel 202 of the superconducting magnet is exerted, and pressure in the refrigerant vessel 202 is maintained within an acceptable pressure range. In addition to this, at least either change amount of magnetic field strength or magnetic field homogeneity in an imaging space due to a pressure change in the refrigerant vessel 202 is compensated by the magnetic field adjustment unit.

6 Claims, 8 Drawing Sheets

(51) Int. Cl.
  *G01R 33/3815* (2006.01)
  *G01R 33/3875* (2006.01)

(56) References Cited

U.S. PATENT DOCUMENTS

| | | |
|---|---|---|
| 2009/0096452 A1 | 4/2009 | Gore et al. |
| 2009/0206839 A1* | 8/2009 | Seeber ............... G01R 33/3815 324/320 |
| 2009/0254227 A1 | 10/2009 | Tsuda |
| 2009/0280989 A1* | 11/2009 | Astra ................. G05D 23/1919 505/163 |

FOREIGN PATENT DOCUMENTS

| | | |
|---|---|---|
| JP | 11-317307 | 11/1999 |
| JP | 2011-5091 | 1/2011 |
| WO | WO 2007/060950 | 5/2007 |

* cited by examiner

MAGNETIC RESONANCE IMAGING APPARATUS AND OPERATING METHOD

TECHNICAL FIELD

The present invention relates to a Magnetic Resonance Imaging (hereinafter, referred to as "MRI") apparatus, and in particular, to an MRI apparatus using a superconducting magnet including a cryocooler.

BACKGROUND ART

An MRI apparatus using a superconducting magnet includes a cryocooler that condenses helium gas vaporized in a liquid helium vessel back to liquid helium again by cooling. Although maintaining pressure in the helium vessel constant is recommended, vaporized liquid helium is liquidized more than needed if a cooling capacity of the cryocooler is too high, which results in too low pressure in the vessel. Therefore, a configuration to maintain pressure in the helium vessel constant by disposing a heater in the vessel to vaporize liquid helium in the vessel as needed is generally adopted.

Also, PTL 1 suggests a technique of increasing or decreasing a cooling capacity itself of a cryocooler when pressure in a vessel is nearing an upper limit value and a lower limit value of predetermined pressure in order to solve a problem in which power consumption of an MRI apparatus rises due to a heater in a helium vessel.

In order to change a cooling capacity, PTL 1 discloses a method to change a frequency of a cooling cycle, a method to stop actions by stopping power supply to a cryocooler, and a method to adjust an amount of compressed helium gas supplied to a cryocooler.

CITATION LIST

Patent Literature

PTL 1: Japanese Published Unexamined Patent Application Publication No.

SUMMARY OF INVENTION

Technical Problem

In the technique described in PTL 1, a response of a cooling capacity of a cryocooler is slower compared to control by heat generation of a heater, and it is difficult to maintain pressure in a helium vessel constant. Therefore, as described in PTL 1, pressure changes within a range (between an upper limit value and a lower limit value) of predetermined pressure. Thus, a slight change of magnetic field performance in a superconducting magnet follows a change of pressure in the helium vessel, which must be accepted.

Also, the technique described in PTL 1 drastically changes a cryocooler control amount (a frequency value of a cooling cycle, ON/OFF of power supply to a cryocooler, and a supply amount of compressed refrigerant gas) stepwise if pressure in a helium vessel is nearing an upper limit value and a lower limit value of predetermined pressure. If a cooling capacity of a cryocooler is increased drastically, refrigerant gas pressure of the cryocooler transitionally becomes high and results in an overload operation of a compressor unit. The overload operation of the compressor unit thermally decomposes internal lubricant oil, which generates methane gas ($CH_4$), carbon monoxide (CO), and hydrogen gas ($H_2$). These decomposed gases cannot be removed completely with an incorporated filter, gets mixed in with refrigerant gas, reaches a cold head, freezes in the cold head, and then results in causes of a cold head failure and cooling capacity deterioration. This phenomenon is referred to as impurity contamination and is a cause of life shortening of a cryocooler.

The present invention was made by considering the above problems, and the purpose is to extend the lifetime of a cooler (cryocooler), to reduce down periods of an MRI apparatus due to cooler maintenance, and to improve the operation rate of an MRI apparatus.

Solution to Problem

In order to solve the above problems, an MRI apparatus of the present invention includes: a superconducting magnet that generates a static magnetic field in an imaging space; a gradient magnetic field coil that applies a gradient magnetic field to an imaging space; a high-frequency coil that applies a high-frequency magnetic field to an imaging space; and a control unit that controls operations of a gradient magnetic field coil and a high-frequency coil to execute a predetermined imaging sequence. The superconducting magnet includes a refrigerant vessel to accommodate a refrigerant and a superconducting coil, a cooler that is connected to the refrigerant vessel and re-condenses refrigerant gas vaporized in the refrigerant vessel, and a detector to detect pressure in the refrigerant vessel. The control unit compares a pressure value detected by the detector with a predetermined set pressure value and continuously performs feedback control that increases a cooling capacity of the cooler if the pressure value is higher than the set pressure value and that reduces a cooling capacity of the cooler if the pressure value is lower than the set pressure value to maintain a thermal equilibrium state at the set pressure value.

Advantageous Effects of Invention

According to an MRI apparatus of the present invention, the following effects can be obtained.

(1) The operation rate of an MRI apparatus can be improved by extending the lifetime of a cooler (cryocooler) to reduce down periods of an MRI examination (imaging) due to the maintenance.

(2) Problems due to impurity contamination can be avoided by preventing an overload operation of a compressor unit in a cooler.

(3) Even in a state where the cooling capacity is reduced due to lifetime of a cooler, liquid helium is prevented from vaporizing, which enables scheduled maintenance.

DESCRIPTION OF EMBODIMENTS

Figure 1:
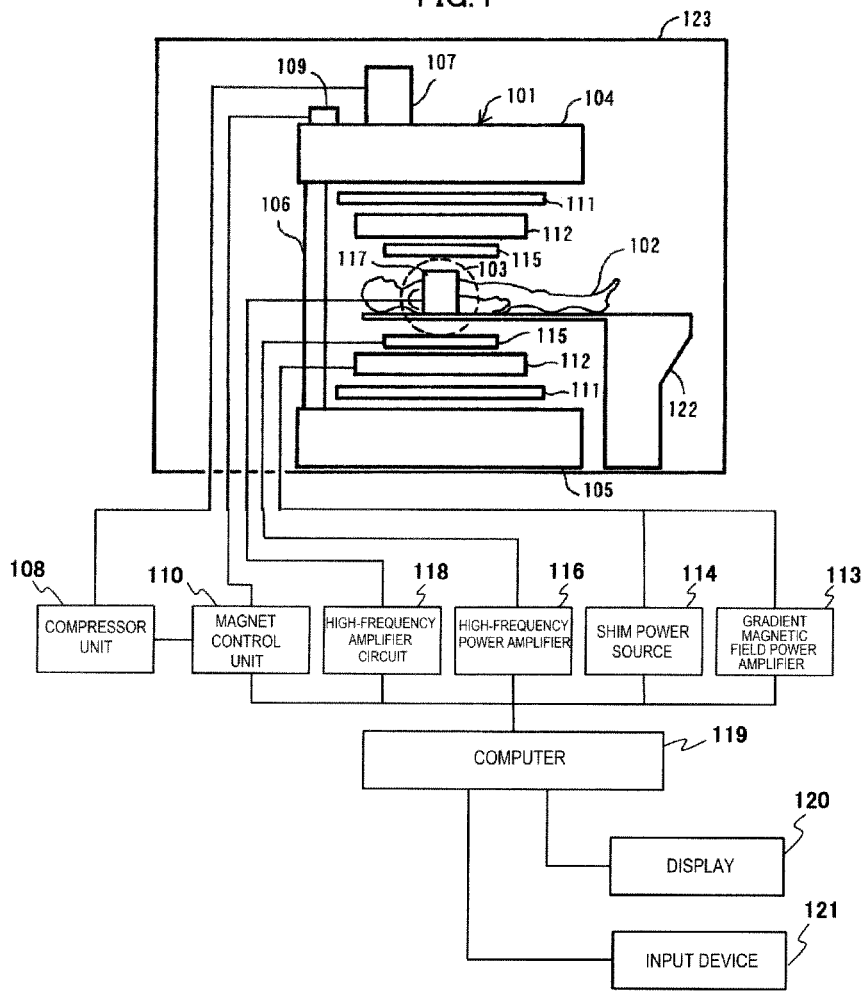
FIG. 1 is a block diagram showing the overall configuration of an MRI apparatus of the present embodiment.

An MRI apparatus related to the present invention includes a superconducting magnet that generates a static magnetic field in an imaging space, a gradient magnetic field coil that applies a gradient magnetic field to an imaging space, a high-frequency coil that applies a high-frequency magnetic field to an imaging space, and a control unit that controls operations of a gradient magnetic field coil and a high-frequency coil to execute a predetermined imaging sequence. The superconducting magnet includes a refrigerant vessel (helium vessel) to accommodate a refrigerant (helium) and a superconducting coil, a cooler (cryocooler) that is connected to the refrigerant vessel and re-condenses refrigerant gas vaporized in the refrigerant vessel, and a detector (pressure sensor) to detect pressure in the refrigerant vessel. The control unit compares a pressure value detected by the detector with a predetermined set pressure value. If a pressure value is higher than the set pressure value, a cooling capacity of the cooler is increased. If a pressure value is lower than the set pressure value, feedback control that reduces a cooling capacity of the cooler is performed continuously to maintain a thermal equilibrium state at the set pressure value.

Thus, because an overload operation can be prevented by performing feedback continuously as a target of the set pressure value, the lifetime of a cooler can be extended. The operation rate of an MRI apparatus can be improved by reducing down periods of an MRI examination (imaging) due to the maintenance.

Also, an MRI apparatus of the second embodiment of the present invention estimates a cooling capacity that should be increased for a cooler based on an amount of heat penetrating into a refrigerant vessel by a gradient magnetic field and high-frequency magnetic field that was calculated per a plurality of types of imaging sequences in advance when the relevant imaging sequence is executed. A cooling capacity of the cooler is continuously increased to the estimated cooling capacity.

An MRI apparatus of the second embodiment can also prevent an overload operation by increasing a cooling capacity continuously based on the estimated amount of heat, which can extend the lifetime of a cooler.

Also, an MRI apparatus of the third embodiment in the present invention controls a cooling capacity of a cooler so as to exert cooling heat absorption almost equivalent to an amount of heat penetrating into a refrigerant vessel, maintains pressure in the refrigerant vessel within an acceptable pressure range, and also compensates at least either change amount of magnetic field strength or magnetic field homogeneity in an imaging space due to a pressure change in the refrigerant vessel.

The MRI apparatus of the third embodiment can prevent an overload operation by controlling a cooling capacity of a cooler so as to exert cooling heat absorption almost matching the amount of heat penetrating into a refrigerant vessel, which can extend the lifetime of a cooler.

In an MRI apparatus of the third embodiment, a superconducting magnet can also be comprised to include a detector that detects pressure in a refrigerant vessel. In this case, a cooling capacity of a cooler can be controlled according to a pressure value detected by the detector.

In an MRI apparatus of the third embodiment, an imaging sequence can also estimate an amount of heat penetrating into a refrigerant vessel using a gradient magnetic field and a high-frequency gradient magnetic field when an imaging sequence is executed depending on the type in the case of a plurality of types of imaging sequences. In this case, a cooling capacity of a cooler can be controlled based on an estimated amount of heat.

A configuration where a relationship between a type of an imaging sequence and a control value of a cooling capacity of a cooler is memorized can also be comprised to estimate an amount of penetrating heat at the next execution of the imaging sequence.

If a cooler has a structure including a cylinder, a displacer, a driving unit that reciprocates the displacer in the cylinder, and a compressor unit that provides a compressed refrigerant gas to the cylinder, at least either of a reciprocating frequency of the displacer or compressing pressure of the refrigerant gas can be controlled to change a cooling capacity of a cooler.

Also, even in a state where an imaging sequence is not executed, the lifetime of the cooler can be extended by feedback control that maintains pressure at a predetermined pressure setting in a refrigerant vessel.

Also, information that shows a change over time of a cooling capacity of a cooler can also be displayed on an image display device (display).

Hereinafter, the embodiments of the present invention will be described based on the attached figures. Additionally, in all the figures to explain the embodiments of the invention, components having the same functions are denoted by the same reference numerals, and explanation thereof will be omitted.

<Overall Configuration of an MRI Apparatus in the Present Embodiment>

First, the overall configuration of an MRI apparatus to be operated in the present embodiment will be described. FIG. 1 shows the overall configuration in a state where an MRI apparatus of the present embodiment is installed in a medical facility.

The superconducting magnet 101 that has an open structure is used as a magnet that generates a static magnetic field of the MRI apparatus. The superconducting magnet 101 with an open structure includes the upper cryostat 104 and the lower cryostat 105. The upper cryostat 104 and the lower cryostat 105 are disposed at the top and bottom of the magnetic field space 103 where the object 102 is placed, the insides are filled with liquid helium, and the superconducting coil 203 (not shown in FIG. 1) that is a magnetomotive force source is disposed. The upper cryostat 104 and the lower cryostat 105 are supported by the connecting tube 106 that is a supporting column and have an open structure with the front, back, left, and right of the magnetic field space 103 opened.

Hence, an oppressive feeling given to the object 102 is alleviated, which can provide a human-friendly examination environment.

The superconducting magnet 101 includes the cold head 107. The cold head 107 is connected to the compressor unit 108 where compressed refrigerant gas is provided. The cold head 107 and the compressor unit 108 comprise a cryocooler of the superconducting magnet 101.

The cold head 107 creates a cooling effect by refrigerant gas being adiabatically expanded inside, which cools the superconducting magnet 101. That is, the cold head 107 has a function that cools the radiation shield plate 216 (not shown in FIG. 1) of the superconducting magnet 101 as well as helium gas after liquid helium is vaporized in the upper cryostat 104 and the lower cryostat 105, condenses it again to liquid helium, and sends it back to the upper cryostat 104.

A cryocooler maintains a thermal equilibrium state and achieves a closed-type superconducting magnet. That is, the cold head 107 is controlled so as to be a cooling capacity required to evenly condense again helium gas vaporized by an amount of heat penetrating into the upper cryostat 104 and the lower cryostat 105. Therefore, the vaporized helium gas is not discharged to the atmosphere.

Also, a plurality of temperature sensors and pressure sensors 206 (not shown in FIG. 1) to monitor the operation state are incorporated in the superconducting magnet 101, and the sensor connection terminal 109 is connected to the magnet control unit 110. The magnet control unit 110 monitors the operation state of the superconducting magnet 101 as well as outputs a signal required to control a cryocooler to the compressor unit 108.

For example, by applying a persistent current of 450 amperes to a superconducting coil that is cooled to the liquid helium temperature (4.2 Kelvin) at a critical temperature or less and in a superconducting state, a stable static magnetic field at the magnetic field strength of 1 Tesla can be generated in the magnetic field space (imaging space) 103.

A pair of the shim plates 111 are installed on the surfaces of the magnetic field space 103 between the upper cryostat 104 and the lower cryostat 105. The shim plates 111 have a plurality of threaded screw holes (not shown in the figures), and small magnetic screws are embedded in appropriate positions. By changing the magnetic flux distribution that the superconducting magnet 101 generates using magnetic fields that the small magnetic screws generate, the magnetic field homogeneity in a spherical space within 40 cm from the center of the magnetic field space 103 is adjusted to a target value (for example, 3 ppm or less).

A pair of the gradient magnetic field coils 112 that generate a gradient magnetic field are disposed on the surfaces of the magnetic field space 103 between the shim plates 111. The gradient magnetic field coils 112 have a flat plate structure so as not to interfere with the open structure of the superconducting magnet 101. A top and bottom pair of the gradient magnetic field coils 112 have a structure where three types of coils (not distinguished in FIG. 1) of x, y, and z that generate a gradient magnetic field in three axial directions orthogonal to each other respectively are layered. The gradient magnetic field power amplifier 113 that independently applies electric current is connected to the x coil, y coil, and z coil respectively.

For example, when positive electric current is applied to the z coil from the gradient magnetic field power amplifier 113, the upper z coil generates a magnetic flux of the same direction as a magnetic flux generated by the superconducting magnet 101 and generates a magnetic flux of the opposite direction to the lower z coil. As a result, a gradient where magnetic flux density is gradually reduced in the direction from the top to the bottom of the z axis (vertical axis) of the magnetic field space 103 is created. Similarly, the x coil and y coil create a gradient magnetic field where the density of the magnetic flux that the superconducting magnet 101 generates looks like a gradient along the x axis and y axis (both are horizontal axes) respectively. These x coil, y coil, and z coil function also as shim coils of the first-order components of inhomogeneous magnetic field of x, y, and z. That is, the gradient magnetic field power amplifier 113 can output by overlapping electric current to generate a gradient with shim current to improve magnetic field homogeneity.

In addition to the x coil, y coil, and z coil, a Bo coil that compensates the strength of a magnetic field the superconducting magnet 101 generates and the high-order modes of x, y, and z such as a shim coil that generates magnetic fields of $x^2$, $y^2$, $x^3$, and $x^2+y^2$ are incorporated in the gradient magnetic field coils 112. Electric current is applied to these by the shim power source 114.

On the magnetic field space 103 sides of the gradient magnetic field coils 112, a pair of the high-frequency coils 115 are installed. The high-frequency coils 115 also have a flat plate structure so as not to interfere with an open structure of the superconducting magnet 101. The high-frequency power amplifier 116 is connected to a top and bottom pair of the high-frequency coils 115 to supply high-frequency electric current. Hence, a high-frequency magnetic field required to cause nuclear magnetic resonance of a nuclear spin on an examination site of the object 102. An MRI apparatus of the present embodiment generates a high-frequency magnetic field of 42 MHz where hydrogen nuclei cause nuclear magnetic resonance at the magnetic field strength of 1 Tesla.

By combining the above static magnetic field, gradient magnetic field, and high-frequency magnetic field that are stable and highly homogeneous, hydrogen nuclei on an examination site of the object 102 can cause a Nuclear Magnetic Resonance (NMR) phenomenon accurately and selectively. Then, three-dimensional position information is added by applying a gradient magnetic field to a precessional motion mechanism of the subsequent nuclear spin in a pulsed manner.

The detection coil 117 is disposed in the almost center position of the magnetic field space 103 i.e., an examination site of the object 102. The detection coil 117 detects a slight magnetic field fluctuation due to the precessional motion mechanism of the nuclear spin as an electric signal (NMR signal) by induced electric current on the detection coil 117. The detected NMR signal is transferred to the high-frequency amplifier circuit 118 connected to the detection coil 117. The high-frequency amplifier circuit 118 provides a signal processing of amplification and detection for an NMR signal and converts into a digital signal appropriate for computer calculation processing.

The computer 119 creates images and spectrum charts from an NMR signal converted into a digital signal for medical diagnoses. Created images etc. are saved in a storage device (not shown in FIG. 1) in the computer 119 and displayed on the display 120. Also, the computer 119 performs image processing and image analysis for the created images etc. to create useful images for diagnoses.

Also, the computer 119 controls applying a gradient magnetic field and high-frequency magnetic field to the object 102 from the gradient magnetic field coils 112 and high-frequency coils 115 at a predetermined timing and detecting a created NMR signal at a predetermined timing to achieve a predetermined imaging method. A series of the timings is referred to as an imaging sequence and varies depending on the imaging method and the imaging condition. The computer 119 creates an imaging sequence that achieves an imaging method and an imaging condition inputted from an operator through the input device 121 by performing a program preliminarily stored in a built-in storage device, and then controls the gradient magnetic field power amplifier 113, the high-frequency power amplifier 116, the high-frequency amplifier circuit 118, etc. Hence, for example, multiple types of imaging methods such a high-speed spin echo method and diffusion-weighted echo-planar method can be achieved under various imaging conditions. Also, the input device 121 is, for example, a key board, mouse, etc.

Operating states of the magnet control unit 110, the gradient magnetic field power amplifier 113, the shim power source 114, the high-frequency power amplifier 116, the high-frequency amplifier circuit 118, etc. are recorded in a built-in storage device by the computer 119. Also, the computer 119 can output the operating state information to the outside via a communication control device (not shown in the figures), which enables remote monitoring of an MRI apparatus.

In addition to this, the patient table 122 that conveys the object 102 to the center of the magnetic field space 103 is disposed in front of the superconducting magnet 101.

The superconducting magnet 101 and the patient table 122 are installed in the examination room 123 provided with an electromagnetic shield. This prevents diagnostic images from quality deterioration caused by an electromagnetic wave that an external device generates being mixed into the detection coil 117 as noise.

<Detailed Structure of a Superconducting Magnet and a Cryocooler>

Detailed structure of the above superconducting magnet 101 and a cryocooler will be further described.

Figure 2:
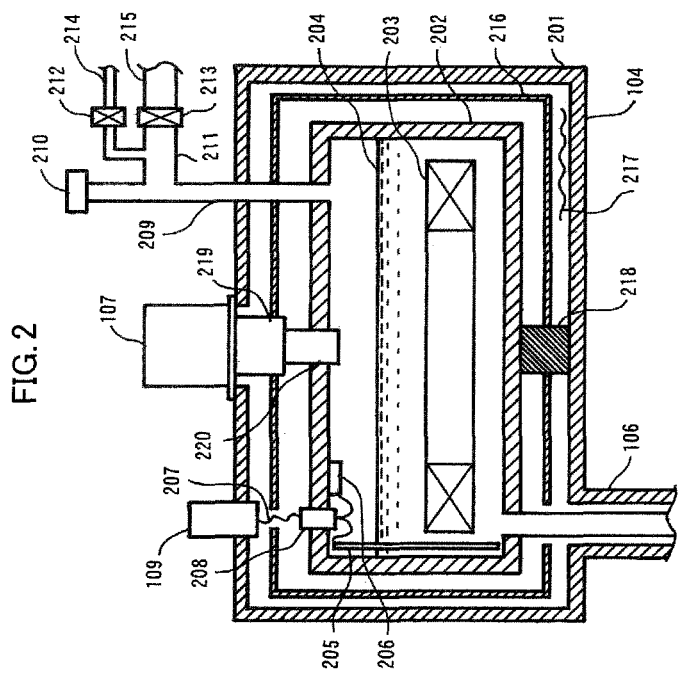
FIG. 2 is an explanatory cross-sectional diagram of details of a superconducting magnet and a cryocooler that comprise an MRI apparatus shown in FIG. 1.

FIG. 2 is a cross-sectional diagram of the details of the superconducting magnet 101 and the cold head 107 in an MRI apparatus shown in FIG. 1. Because internal structures of the upper cryostat 104 and the lower cryostat 105 are basically symmetrical with respect to the magnetic field space 103 as the center, the superconducting magnet 101 will be explained using only the upper cryostat 104 in FIG. 2.

The upper cryostat 104 includes the vacuum vessel 201, the helium vessel 202 disposed in the inside, and the superconducting coil 203 disposed inside the helium vessel. There is a vacuum layer between the vacuum vessel 201 and the helium vessel 202, and the radiation shield plate 216 is disposed in the layer.

The load support 218 is installed to fix the positions of the vacuum vessel 201, the radiation shield plate 216, and the helium vessel 202 each other. Although only one load support 218 is shown in FIG. 2, the load supports are installed in a plurality of locations actually.

The vacuum vessel 201 is made of 10-millimeter-thick stainless steel and has rigidity that can endure even a weight of the main body and the inside vacuum pressure. The helium vessel 202 is made of 15-millimeter-thick stainless steel and has rigidity that can endure an electromagnetic power applied to the superconducting coil 203 and a difference in pressure inside and outside. The superconducting coil 203 in the helium vessel 202 is comprised of a plurality of coils (only one of them is shown in FIG. 2). The superconducting coil 203 is fixed in the helium vessel 202. The radiation shield plate 216 is made of 5-millimeter-thick aluminum. Mirror polishing process is performed on the surface to reduce radiation heat. Also, the super insulator 217 (only a portion of the insulator is illustrated in the figure) is laid in the gap between the vacuum vessel 201 and the radiation shield plate 216. The super insulator 217 is comprised of multiple layers of a polyethylene sheet on which an aluminum thin film is evaporated and has an effect to reduce radiation heat. The load support 218 is made of stainless steel, reinforced carbon resin, and reinforced plastic resin to minimally reduce conducting heat that is conducted from the vacuum vessel 201 to the radiation shield plate 216, and then to the helium vessel 202.

The helium vessel 202 is filled with the liquid helium 204 by almost 90% of its volume so that the superconducting coil 203 is immersed in the liquid helium 204. Hence, the superconducting coil 203 is cooled to 4.2 Kelvin (−268.8° C.) that is the boiling temperature of the liquid helium 204, which can maintain a superconducting state.

In the helium vessel 202, the liquid level sensor 205 that measures the liquid level of the liquid helium 204 and the pressure sensor 206 that measures pressure of helium gas vaporized from the liquid helium 204 are disposed. The output signal line 207 of these sensors is pulled out to the outside of the superconducting magnet 101 from the sensor connection terminal 109 via the hermetic seal 208.

On the top of the helium vessel 202, the service port 209 and the cold head 107 are disposed. The service port 209 has a structure where an injection pipe (not described in the figure) can be inserted with the plug 210 on the top opened when injecting new liquid helium. From the middle of the service port 209, the exhaust pipe 211 for helium gas is connected. The exhaust pipe 211 is divided into two, and the relief valve 212 that opens the plug when pressure in the helium vessel is 20 kPa or more is installed on one side. On the other side, the rupture disk 213 that opens when pressure reaches 40 kPa is installed. Hence, the helium vessel 202 is being operated under pressure of 20 kPa or less while operating the superconducting magnet 101. If a large amount of gas needs to be exhausted in a case such as where quench occurs or where magnet field decay is required urgently, the relief valve 212 and the rupture disk 213 are opened in order so as not to apply pressure of a certain level or more to the helium vessel 202, which secures safety.

Also, the pressure acceptable range of the helium vessel 202 is set from 1 kPa to 20 kPa for examination (imaging) by an MRI apparatus. Although a static magnetic field of the magnetic field space 103 that the superconducting coil 203 forms changes due to pressure change of the helium vessel 202, it is confirmed in advance that the gradient magnetic coil, Bo coil, and shim coil explained in FIG. 1 can correct a change of static magnetic field within the pressure range.

The cold head 107 on the top of the helium vessel 202 has two cooling stages: the first cooling stage 219 of the first phase is at 43 Kelvin (−230° C.) and has an approximately 45-Watt cooling capacity under the rated operation as well as the second cooling stage 220 of the second phase is at 4 Kelvin (−269° C.) and has an approximately 1-Watt cooling capacity under the rated operation as well.

The first cooling stage 219 of the cold head 107 thermally contacts the radiation shield plate 216 to cool the radiation shield plate 216. The radiation shield plate 216 achieves thermal equilibrium at the temperature of approximately 70 Kelvin (−203° C.) under the rated operation of the cold head 107. The second cooling stage 220 of the cold head 107 is placed in the helium gas accumulation area on the top of the helium vessel 202, and cools helium gas directly to the boiling point of 4.2 Kelvin to condense the gas.

<Cooling Operation of a Cryocooler>

Figure 3:
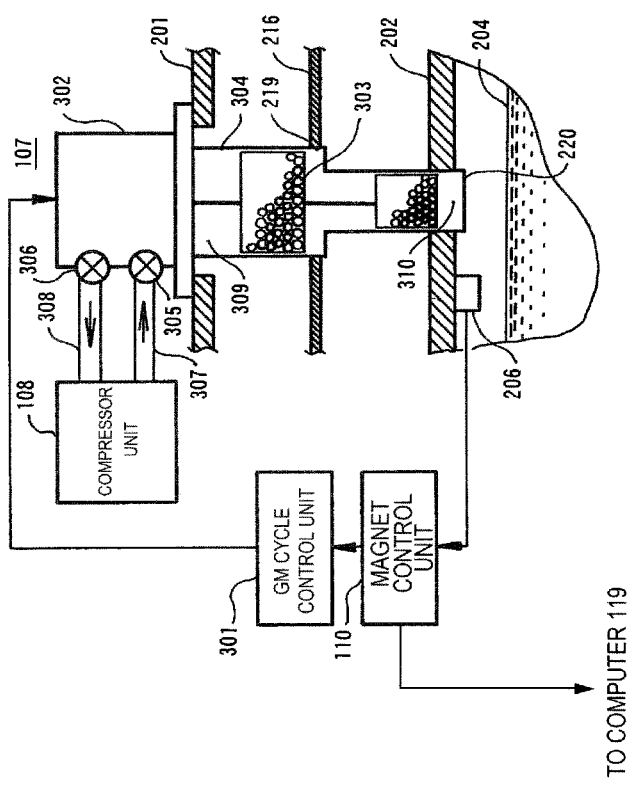
FIG. 3 is an explanatory diagram of the structure of a cryocooler in the first embodiment and the control circuit.

Next, the cooling operation of the cryocooler will be described with reference to FIG. 3. The cryocooler has the GM cycle control unit 301 in addition to the cold head 107 and the compressor unit 108, and the GM cycle control unit 301 is controlled by the magnet control unit 110.

The cold head 107 includes the cylinder 304 that has a two-stage structure of the first stage 219 and the second stage 220, the displacer 303 that has a two-stage structure, and the displacer driving unit 302 that reciprocates the displacer 303 in the cylinder 304. Cooling storage agents of lead spheres in a first stage and copper holmium spheres in a second stage are placed in the displacer 303 and have a structure where these materials are thermally displaced in a process of refrigerant gas passing.

The displacer driving unit 302 includes the intake valve 305 and exhaust valve 306, and these are opened and closed by being synchronized with reciprocation of the displacer 303. The intake valve 305 and exhaust valve 306 are connected to the compressor unit 108 via the pressure gas hose 307 and 308 respectively.

The cold head 107 generates a cooling effect by operating in the order of the following steps (1) to (3).

(1) By moving the displacer 303 downward, the upper space 309 in the cylinder 304 is filled with refrigerant gas compressed in the compressor unit 108 and sent from the exhaust valve 305 through the pressure gas hose 307.

(2) Next, by moving the displacer 303 upward, the refrigerant gas passes through the cooling storage agents in the displacer 303, and then moves to the lower space 310.

(3) Being synchronized with the displacer 303 reaching the top, the exhaust valve 306 opens. The refrigerant gas in the cylinder 304 is adiabatically expanded due to pressure reduction, and the temperature lowers. Then, the refrigerant gas goes back to the compressor unit 108 from the exhaust valve 306 through the pressure gas hose 308.

By repeating the cycle (1) to (3), refrigerant gas continuously absorbs heat from the lower space 310 of the cylinder 304. This heat cycle is referred to as a Gifford-McMahon cycle (GM cycle), and a cooling device using the GM cycle is referred to as a GM-type cryocooler. On account of the simplicity and high quality of the structure, the GM cycle is adopted for a superconducting magnet of an MRI apparatus.

First Embodiment

In the first embodiment, a cooling capacity of a cryocooler is controlled so that cooling heat absorption almost equivalent to an amount of heat penetrating into the helium vessel 202 is exerted, and pressure in a helium vessel is maintained within an acceptable pressure range. Also, a magnetic field adjustment unit compensates magnetic field strength of an imaging space (magnetic field space) and a change amount of magnetic field homogeneity accompanying a pressure change in the helium vessel.

A control method in this case is to use a continuous feedback control method where a cooling capacity of a cryocooler is increased when a pressure value is larger than a set pressure value and is reduced when a pressure value is smaller than a set pressure value after comparing a pressure value that is in a helium vessel and detected by a pressure sensor with a predetermined set pressure value.

The present embodiment increases or reduces a cooling capacity of a cryocooler by changing a reciprocating vibration frequency (hereafter called as a GM cycle number) of the displacer 303 in the cold head 107.

First, FIG. 3 will be explained for a circuit configuration of pressure control in the helium vessel 202. The GM cycle control unit 301 is disposed between the magnet control unit 110 and the cold head 107. The GM cycle control unit 301, the magnet control unit 110, and the computer 119 comprise a control unit of the present invention.

The GM cycle control unit 301 supplies a motor of the displacer driving unit 302 with driving electric power of a predetermined frequency based on a signal of the pressure sensor 206 in the helium vessel 202 that is output from the magnet control unit 110. Hence, the cold head 107 is controlled via a helium gas pressure in the helium vessel 202 by comprising a return loop (feedback loop): (a helium gas pressure in the helium vessel 202)→(pressure gas detection by the pressure sensor 206)→(the magnet control unit 110)→(the GM cycle control unit 301)→(a reciprocating vibration frequency change of the cold head 107)→(a gas pressure change by condensation of helium gas in the helium vessel 202).

Figure 4:
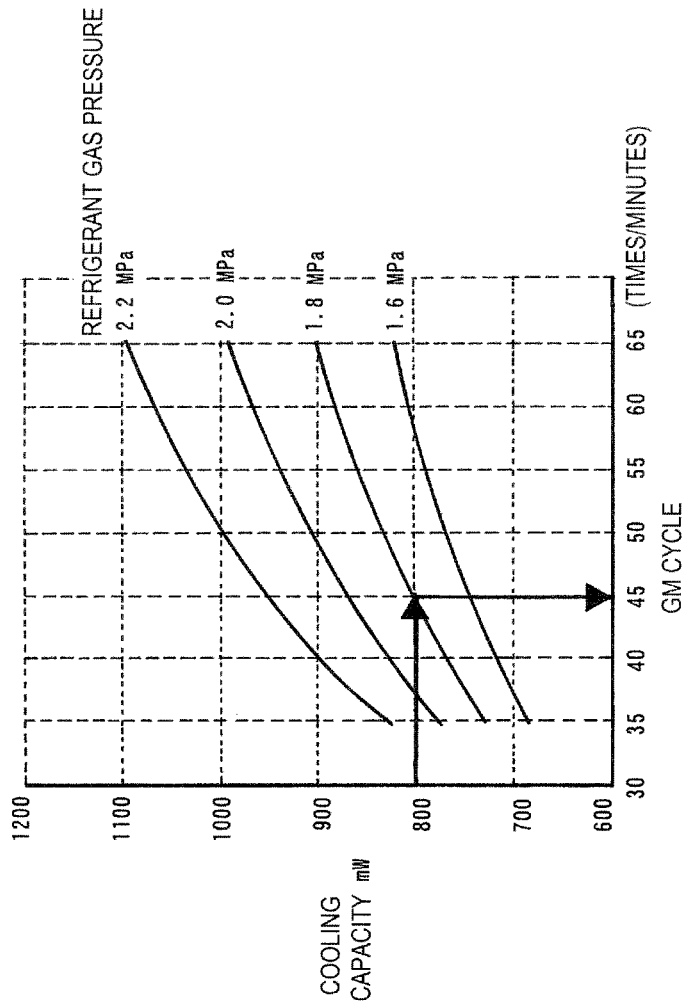
FIG. 4 is a diagram showing an example of cooling characteristics of a cryocooler.

The superconducting magnet 101 shown in FIGS. 1 and 2 has, for example, approximately 800 mW of an amount of heat penetrating into the helium vessel 202 and has the pressure of 9 kPa in a normal operating state. To achieve thermal equilibrium with a cooling capacity of a cryocooler in such state, a cooling capacity of the second stage 220 in the cold head 107 also needs to be 800 mW. As shown in FIG. 4, a cooling capacity of the cold head 107 increases as a GM cycle vibration frequency increases, and the magnitude depends on a refrigerant gas pressure value. For an example in FIG. 4, the cooling capacity of 800 mW is exerted in the GM cycle of 1.8 MPa refrigerant gas pressure, 45 times per minute.

Therefore, in the present embodiment, feedback control is performed so that the set pressure value of 9 kPa in the helium vessel 202 is maintained. At the same time, refrigerant gas pressure in the compressor unit 108 should be adjusted to 1.8 MPa. Hence, thermal equilibrium is achieved for the superconducting magnet 101 and a cryocooler in heat generation and heat absorption of 800 mW.

The operation will be described in detail using the flow in FIG. 5.

First, the magnet control unit 110 judges whether the computer 119 is executing an imaging sequence or not by receiving a signal from the computer 119. When an imaging sequence is being executed, after proceeding to Step 502, pressure is taken in from the pressure sensor 206 in the helium vessel 202.

The magnet control unit 110 goes back to Step 501 and 502 to repeat pressure detection when pressure detected by the pressure sensor is equal to the set pressure value of 9 kPa. When detected pressure is greater than the set pressure value of 9 kPa, the GM cycle control unit 301 is instructed so as to continuously increase a vibration frequency of a GM cycle, and when detected pressure is less than the set pressure value of 9 kPa, the GM cycle control unit 301 is instructed so as to continuously reduce a vibration frequency of a GM cycle (Step 504, 505, and 506).

For example, if the object 102 is being imaged in a high-speed spin echo mode, an amount of heat penetrating into the helium vessel 202 increases by approximately 100 mW due to a gradient magnetic field that is applied from the gradient magnetic field coils 112 and a high-frequency magnetic field that the high-frequency coils 115 generates. Hence, vaporization of the liquid helium 204 in the helium vessel 202 increases, which shifts pressure in the helium vessel 202 from 9 kPa to the rising trend. Specifically, 0.125 liters of liquid helium is vaporized per hour by 100 mW heat. The vaporized liquid helium turns into helium gas of approximately tenfold volume (0.92 liters precisely) and accumulates in the upper portion of the helium vessel 202, which increases the pressure.

The magnet control unit 110 detects this in the above Step 504 and instructs the GM cycle control unit 301 to increase a vibration frequency of a GM cycle in Step 505. The GM cycle control unit 301 continuously increases a vibration frequency at that time (for example, 45 times per minute) at a predetermined rising rate. Hence, a cooling capacity of the second stage 307 in the cold head 107 shifts to an increase, which achieves feedback control that reduces the increased pressure.

Next, the magnet control unit 110 transfers a pressure value detected in Step 502 to the computer 119, The computer 119 controls at least either of the gradient magnetic field power amplifier 113 or the shim power source 114 according to a difference between a set pressure value and a detected pressure value and generates a magnetic field that compensates errors in strength and homogeneity of a static magnetic field associated with a pressure change. Specifically, in the computer 119, data is stored in advance that shows the corresponding relationship between a difference from a set pressure value of internal pressure in the superconducting magnet 101 that was measured in advance using a measuring method to be described later and changing components of strength and homogeneity for a static magnetic field of the magnetic field space 103. The computer 119 reads out changed components of strength and homogeneity for a static magnetic field from the above stored data that corresponds to a difference between a current pressure value received from the magnet control unit 110 and a set pressure value and generates magnetic field components (shim amount) that compensates the changed components by controlling the gradient magnetic field power amplifier 113 and the shim power source 114 (Step 507). That is, an imaging sequence is executed while a magnetic field where the shim amount is added is being generated. Hence, imaging can be performed while magnetic field fluctuation of the superconducting magnet 101 associated with pressure fluctuation in the helium vessel 202 is being compensated. While an imaging sequence is being executed, these Steps 501 to 507 are repeated.

As can be appreciated from FIG. 4, because a cooling capacity of 900 mW is exerted when a vibration frequency of a GM cycle reaches 65 times per minute, the superconducting magnet 101 and a cryocooler newly go into a thermal equilibrium state. Although pressure in the helium vessel 202 rises to 11 kPa while a cooling capacity of the cryocooler reaches 900 mW, the pressure is reduced as a vibration frequency of a GM cycle rises.

When an imaging sequence is completed, the procedure proceeds to Step 508 from Step 501, and only Steps 502 to 506 are performed. Namely, when an imaging sequence is completed, only pressure control is executed without compensating a magnetic field. Hence, control to maintain pressure at a certain level is performed according to a pressure change associated with environmental changes such as an atmospheric pressure change without performing imaging.

When an imaging sequence is completed, an amount of heat penetrating into the helium vessel 202 reduces to 800 mW, and therefore a cooling capacity of the second stage 307 in the cold head 107 is higher by 100 mW, which results in a thermally unbalanced state. When helium gas recondensation exceeds a vaporization amount, pressure in the helium vessel 202 shifts to the downward trend.

If pressure in the helium vessel 202 is reduced much lower than 9 kPa of the set pressure value due to an overshoot, the procedure proceeds from Step 504 to Step 506 to continuously reduce a vibration frequency of a GM cycle at a predetermined rate.

Repeating the above operation gradually reduces a set pressure value to 9 kPa and a GM cycle to 45 times per minute. When heat penetrating into the helium vessel 202 and a cooling capacity of a cryocooler are equal to each other at 800 mW, the thermal equilibrium state is resumed again.

Thus, the present embodiment is considerably different in that a GM cycle is changed continuously until reaching thermal equilibrium from the technique described in Patent Literature 1 where a control amount of a cryocooler is changed in a stepwise manner. Because the present embodiment changes a GM cycle continuously, a transient load is not applied to the displacer driving unit 302 in the cold head 107, and transient high pressure of refrigerant gas does not generate. As a result, this can prevent the compressor unit 108 from an overloaded operation and a cryocooler from lifetime shortening.

Here, a method used in the above Step 507 to measure data will be described that shows the corresponding relationship between a difference from a set pressure value of internal pressure in the superconducting magnet 101 and changing components of strength and homogeneity in the magnetic field space 103.

This measurement is performed by the computer 118 executing a program with a function to analyze and correct magnetic field performance of the magnetic field space 103.

(1) First, an examination mode starts to measure an NMR signal of the object 102 or a phantom placed in the magnetic field space 103 when an electric current is not applied to the gradient magnetic field coils 112, Bo coil, and all the shim coils.

(2) A Fourier transform is performed for the measured NMR signal in the computer 119, and frequency components of the NMR signal are obtained.

(3) At a magnetic field strength of 1 Tesla, a magnetic field is calculated that corresponds to a difference between the nuclear magnetic resonance frequency of 42 MHz of a hydrogen nucleus spin and a frequency obtained in the above step. Then, the shim power source 114 is controlled so that the Bo coil generates a differential magnet field.

(4) Next, for example, an NMR signal of the object 102 is measured in a state where an electric current of 10 Amperes is applied to an x coil.

(5) The measured NMR signal is developed using spherical harmonics, and an error magnetic field in the x-axis direction of the imaging space 103 is analyzed to obtain a shim current.

(6) Similarly, components of an error magnetic field are analyzed also for the y axis and z axis to obtain a shim current.

(7) Operations of the above (1) to (6) are performed while variously changing a pressure value of the helium vessel 202, and data where a shim amount (Bo and shim current) is associated with a pressure value from a set pressure value is created to store in a storage device in the computer 119.

By referring to this data to determine the shim amount in Step 507, the gradient magnetic field power amplifier 113 and the shim power source 114 can be controlled so that an optimum shim current is applied for respective components of the x coil, y coil, z coil, and shim coil of the gradient magnetic field coils 112. Hence, as pressure in the helium vessel 202 changes, even in a case where magnetic fields of the superconducting magnet and the magnetic field space 103 fluctuate, the magnetic field space 103 that compensates this can be formed, which enables high-precision imaging.

Second Embodiment

Figure 6:
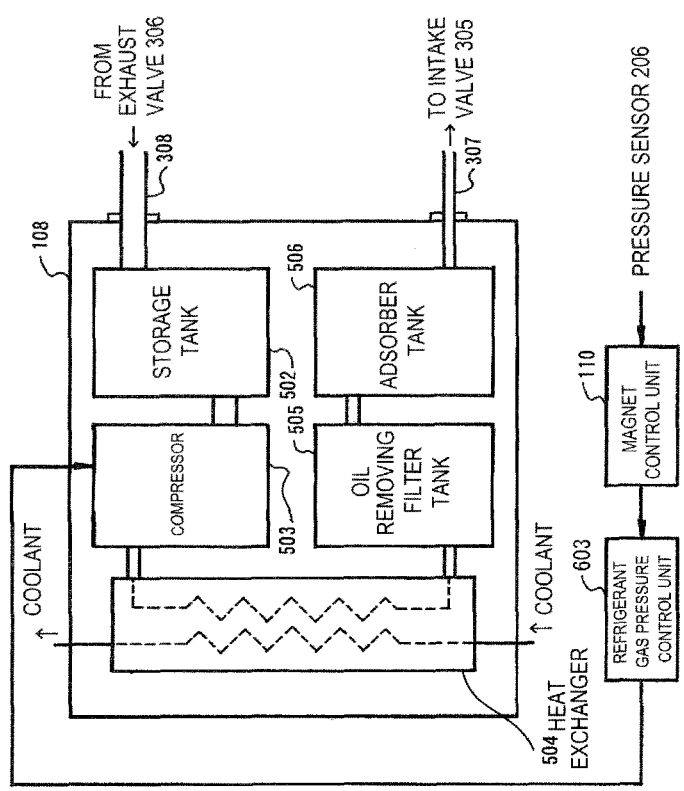
FIG. 6 is an explanatory diagram of a control circuit of a cryocooler in the second embodiment.

Next, the second embodiment will be described with reference to FIG. 6. The second embodiment has a stable GM cycle and controls a cooling capacity of a cryocooler by changing gas pressure of refrigerant gas to be supplied from the compressor unit 108 to the cold head 107. Therefore, in the second embodiment, as shown in FIG. 6, the refrigerant gas pressure control unit 603 is disposed to control the compressor unit 108. Other configuration and operation are the same as the first embodiment. The refrigerant gas pressure control unit 603, the magnet control unit 110, and the computer 119 comprise a control unit of the present invention.

As shown in FIG. 6, inside the compressor unit 108, the storage tank 502, the compressor 503, the heat exchanger 504, the oil removing filter tank 505, and the adsorber tank 506 are disposed. Expanded refrigerant gas is sent through the pressure gas hose 308 and temporarily stored in the storage tank 502. Then, the refrigerant gas is compressed into high pressure in the compressor 503 and becomes a high temperature due to a compression mechanism. The refrigerant gas is cooled approximately to a room temperature in the heat exchanger 504 and stored in the adsorber tank 506 via the oil removing filter tank 505. In the oil removing filter tank 505, oil mist mixed in refrigerant gas of a lubricant used in the compressor 503 is removed. In the adsorber tank 506, impure gases such as methane gas generated by a thermally decomposed lubricant is removed. The refrigerant gas in which impurities are filtered is supplied to the cold head 107 through the pressure gas hose 307. The above basic configuration is the same even in the compressor unit 108 of the first embodiment.

Figure 5:
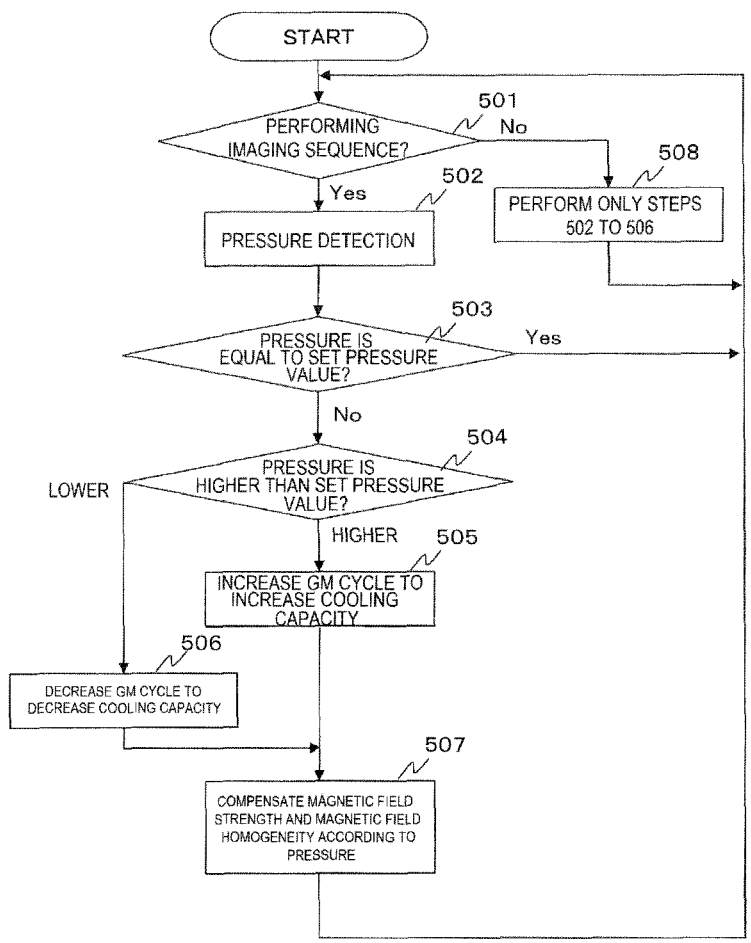
FIG. 5 is a flow chart showing control operation of a cryocooler in the first embodiment.

In the second embodiment, the refrigerant gas pressure control unit 501 changes pump rotation of the compressor 503 according to a pressure value of the helium vessel 202 at Steps 505 and 506 in FIG. 5. Hence, the compressor unit 108 changes refrigerant gas pressure in the range from 1.2 MPa to 2.4 MPa and supplies refrigerant gas to the cold head 107.

As described in the first embodiment, the amount of heat penetrating into the helium vessel 202 is approximately 800 mW, and the pressure is 9 kPa when the superconducting magnet 101 shown in FIGS. 1 and 2 is in a normal operation state. To achieve thermal equilibrium with a cooling capacity of a cryocooler at this point, a cooling capacity of the second stage 220 in the cold head 107 needs 800 mW. In light of characteristics of a cryocooler shown in FIG. 4, it turns out that the cooling capacity of 800 mW is exerted at the refrigerant gas pressure of 1.8 MPa when a GM cycle is stable at 45 times per minute. The compressor 503 adopts an inverter circuit control system so as to compress refrigerant gas pressure to 1.8 MPa at the frequency of 120 Hz in a steady state.

In the thermal equilibrium state, if imaging the object 102 is executed similarly to the first embodiment in a high-speed spin echo sequence, an amount of heat penetrating into the helium vessel 202 increases by approximately 100 mW under the influence of a gradient magnetic field and high-frequency magnetic field by the high-speed spin echo sequence. Hence, pressure in the helium vessel 202 shifts from 9 kPa to the upward trend. Depending on the pressure that the pressure sensor detects, the magnet control unit 110 instructs the refrigerant gas pressure control unit 501 to increase the cooling capacity (Step 505). The refrigerant gas pressure control unit 501 continuously increases a frequency of the compressor 503 from 120 Hz. Hence, refrigerant gas pressure is also increased from 1.8 MPa continuously and gradually, and a cooling capacity of the second stage in the cold head 107 shifts to an increase.

Once the driving frequency of the compressor 503 has reached 170 Hz, the cooling capacity of 900 mW is exerted, which results in a new thermal equilibrium state. While a cooling capacity reaches 900 mW, pressure in the helium vessel 202 rises as high as 11 kPa.

When an amount of heat penetrating into the helium vessel 202 is reduced back to 800 mW after an imaging sequence is completed, a cooling capacity of the second stage 307 in the cold head 107 is higher by 100 mW, which results in a thermally unbalanced state. Therefore, recondensation of helium gas exceeds the vaporization amount, and pressure in the helium vessel 202 shifts to the downward trend. If pressure in the helium vessel 202 is reduced to less than 9 kPa due to an overshoot, a frequency of the compressor 503 should be reduced to reduce a cooling capacity (Steps 504 and 506). By repeating this, heat penetrating into the helium vessel 202 can be equal to a cooling capacity of a cryocooler, which results in a thermal equilibrium state again.

Because the second embodiment changes refrigerant gas pressure continuously to achieve thermal equilibrium, an overload operation of a compressor can be avoided, resulting in extending the lifetime of a cryocooler.

Additionally, unnecessary electric power consumption can be reduced by operating the compressor 503 that occupies most of electric power consumption by a cryocooler using an inverter circuit. In addition, a redundancy is given to a power-supply system that must increase the capacity in proportion to the power consumption by the compressor 503.

The above first embodiment is configured so that a cooling capacity of a cryocooler is controlled by maintaining refrigerant gas pressure constant and changing the number of a GM cycle. On the other hand, the second embodiment is configured so that the cooling capacity is controlled by maintaining a GM cycle constant and changing refrigerant gas pressure. Therefore, the configuration of changing a GM cycle and the configuration of changing refrigerant gas pressure are combined with each other, which can provide an MRI apparatus that uses a refrigerant gas pressure change in conjunction with a GM cycle change. Because a range of an amount of heat penetrating into the helium vessel 202 is not changed, change ranges of the refrigerant gas pressure and the number of a GM cycle can be narrowed down to smaller ranges when a cooling capacity of a cryocooler is controlled by combining the two configurations. This is a better operating condition to avoid an overload operation of the compressor unit 108.

Also, in both the first embodiment and the second embodiment, the number of a GM cycle and a frequency of an inverter circuit in the compressor 503 do not need to be obtained exactly. This is because a cooling capacity of a cryocooler is reflected in gas pressure of a helium vessel. Using a feedback group of (helium gas pressure in the helium vessel 202)→(the pressure sensor 206)→(the magnet control unit 110)→(the GM cycle control unit 301 or the refrigerant gas pressure control unit 501)→(the cold head 107)→(a pressure change by helium gas condensation in the helium vessel 202), a cooling capacity of a cryocooler is exactly controlled so as to be equal to an amount of helium gas vaporizing in the helium vessel 202 i.e., an amount of heat penetrating into the helium vessel 202.

In the previous description, although only a cooling capacity of the second cooling stage 220 is described, a cooling capacity of the first cooling stage 219 also changes according to the number of a GM cycle and refrigerant gas pressure. When a cooling capacity of the first cooling stage 219 is increased, a temperature of the radiation shield plate 216 is lowered, and an amount of heat penetrating into the helium vessel 202 is reduced. Additionally, vaporization of the liquid helium 204 in the helium vessel 202 is reduced, which reduces the pressure in the helium vessel 202. That is, the first cooling stage 219 also works on pressure in the helium vessel 202 and functions to reach a thermal equilibrium state with the same trend as the second cooling stage 220. This is also an effective means to achieve a thermal equilibrium state of the superconducting magnet 101 and a cryocooler by controlling a cooling capacity of a cryocooler using a pressure signal of the helium vessel 202.

Third Embodiment

Figure 7:
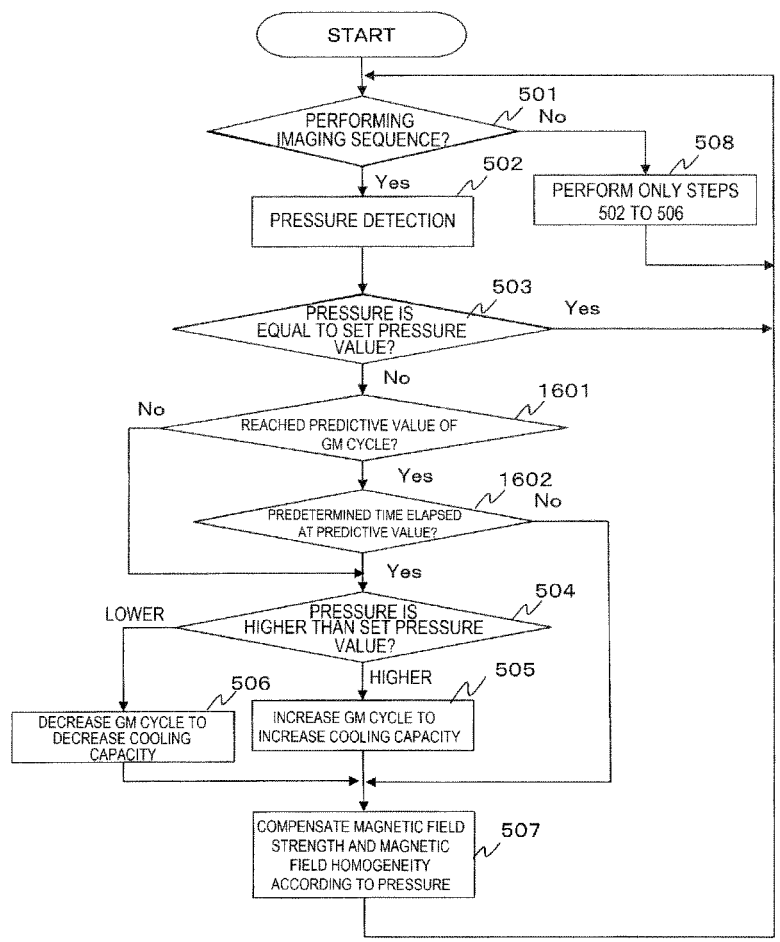
FIG. 7 is a flow chart showing control operation of a cryocooler in the third embodiment.

The third embodiment will be described with reference to FIG. 7. In the third embodiment, size of a cooling capacity that should be increased for a cryocooler is estimated based on an amount of heat that penetrates into a helium vessel using a gradient magnetic field and high-frequency magnetic field when an imaging sequence is executed and that is calculated with respect to each imaging sequence type and imaging condition in advance. Until reaching an estimated cooling capacity size, a cooling capacity of a cryocooler is continuously increased. Once reaching an estimated value, the estimated value is maintained for a predetermined time. This can prevent an overshoot. Hereinafter, the details will be described.

Pressure in the helium vessel 202 is subject to an atmospheric pressure change around the superconducting magnet 101.

This is because the boiling point of the liquid helium 204 changes (latent heat of the liquid helium 204 changes) and an amount of liquid helium vaporization changes. On the other hand, a temperature of the radiation shield plate 216 caused by an overcurrent of a gradient magnetic field and high-frequency magnetic field when an imaging sequence is executed and pressure in the helium vessel 202 by heat generation in the helium vessel 202 change significantly. Although an atmospheric pressure change has a relatively long cycle and the change amount is 2 or 3 kPa, a pressure change of the helium vessel 202 associated with executing an imaging sequence is short and the change amount significantly changes depending on the type of an imaging sequence.

Normally, the liquid helium 204 in the helium vessel 202 of the superconducting magnet 101 is accumulated at the saturation temperature, and heat penetrating into the helium vessel is consumed as vaporized heat of the liquid helium 204. This shows that heat generation by an imaging sequence reflects a pressure change of helium gas in an early response.

On the other hand, a cooling capacity change of the cold head 107 takes a few minutes because a heat cycle of refrigerant gas needs to be repeated and cooling storage agents in a displacer as well as an amount of heat of a cylinder are included. The time difference between a change of heat penetrating into the helium vessel 202 and a cooling capacity change of a cryocooler causes a control delay in a feedback group mentioned in the first and second embodiments. Due to the delay, pressure in the helium vessel 202 shows an overshoot and undershoot.

Therefore, in the third embodiment, operation contents of a gradient magnetic field and high-frequency magnetic field as well as a change amount of heat generation of the helium vessel 202 are an amount of heat generation with respect to each imaging sequence type and imaging condition (imaging mode). For example, an amount of penetrating heat is calculated in advance by measuring or computing as approximately 100 mW in a high-speed spin echo method and 300 mW in a diffusion weighted echo planar method. Additionally, for the amount of penetrating heat, a frequency of a GM cycle and refrigerant gas pressure required so that a cooling capacity of the cold head 107 achieves a thermal equilibrium state are calculated by measuring or computing and is stored in the computer 119.

Hence, control values of a GM cycle and refrigerant gas pressure is estimated to enable a more smooth change. That is, as shown in FIG. 7, the third embodiment is configured that Steps 1601 and 1602 are arranged, and Steps 504 and 505 are performed to increase a cooling capacity until reaching estimated values of a frequency of a GM cycle and refrigerant gas pressure, but once reaching the estimated values, the estimated values are maintained until a predetermined time elapses at the estimated values (Steps 1601 and 1602).

Also, as estimated values of an amount of heat generation with respect to each imaging sequence type and imaging condition, an increase amount (a frequency of a GM cycle and refrigerant gas pressure) of a cooling capacity increased in Step 505 when an imaging sequence was previously executed can also be used when the next imaging sequence executes. That is, an increase amount of a cooling capacity executed at that time is accumulated in the computer 119 as the next estimated values with respect to each imaging sequence type and imaging condition each time operations in FIG. 7 is repeated. Hence, without computing or measuring in advance, a cooling capacity can be increased during operation using the estimated values in the next imaging sequence.

In the present embodiment, an overshoot is reduced; as a result, a thermal equilibrium state can be achieved early. Also, a sharp change in a frequency of a GM cycle or refrigerant gas pressure can be reduced, which is effective to prevent an overload operation.

Also, in the present embodiment, control accuracy can be improved by sequentially comparing actual control values of a GM cycle and refrigerant gas pressure with the estimated values, which enables to check changes over time of cooling capacities of the superconducting magnet 101 and a cryocooler.

<Effects of the Present Embodiment>

As described in the respective embodiments, according to the present invention, an extra amount of heat such as heat generation by a heater in the helium vessel 202 is not required to compensate, and a stress on the displacer driving unit 302 as well as an overload operation of a compressor unit can be avoided by a control to change a cooling capacity continuously. That is, a deterioration characteristic slower than a normal cooling capacity deterioration trend is expected, which enables operation longer than the rated life.

Normally, although the cold head 107 reduces its cooling capacity by wear of the displacer driving unit 302 and impurity accumulation in cooling storage agents when the operation exceeds approximately 10,000 hours in a regulated state of a GM cycle and refrigerant gas pressure, cooling capacity reduction can be delayed according to the above respective embodiments.

Also, as described in the first embodiment, because a frequency of a GM cycle is controlled by the detected pressure even in a state where an imaging sequence is not executed, operational time of a cryocooler can be extended.

For example, if a cooling capacity of the second cooling stage 220 in the cold head 107 is reduced from 800 mW to 700 mW after operating time of a cryocooler reaches 15,000 hours, the operation in the present invention is as follows to execute Steps 502 to 506 at Step 508 in FIG. 5.

The amount of heat penetrating into the helium vessel 202 is 800 in a normal state. A cooling capacity of the second cooling stage 220 of the cold head 107 has reduced to 700 mW. In this case, helium gas of 0.9 liter per hour accumulates in a helium gas accumulation room of the helium vessel at the amount of 100 mW heat that is the difference between the amount of penetrating heat and the amount of cooling heat and increases the pressure. Therefore, the pressure sensor 206 shows the upward trend from 9 kPa.

The magnet control unit 110 receives a signal from the pressure sensor 206, controls the GM cycle control unit 301, and increases the reciprocation of the displacer 303, for example, to 60 times per second (Steps 502 to 505). Consequently, a cooling capacity of the second cooling stage 220 in the cold head 107 increases to 800 mW, and pressure in the helium vessel 202 reaches a thermal equilibrium state around 12 kPa. Alternatively, thermal equilibrium can be achieved similarly by increasing refrigerant gas pressure to 2.0 MPa using the refrigerant gas pressure control unit 501 of the second embodiment.

Thus, according to the present embodiment, even when deterioration of a cooling capacity of the cold head 107 requires maintenance, a cooling capacity can be exerted corresponding to heat penetrating into the helium vessel 202, which can extend the lifetime of the cold head 107 substantially and delay maintenance or enable scheduled maintenance. This also improves the operating rate of an MRI apparatus and reduces the cost for maintenance. Also, by monitoring control information about the GM cycle control unit 301 and the refrigerant gas pressure control unit 501, an operator can manage the deterioration rate of the cold head 107.

Figure 8:
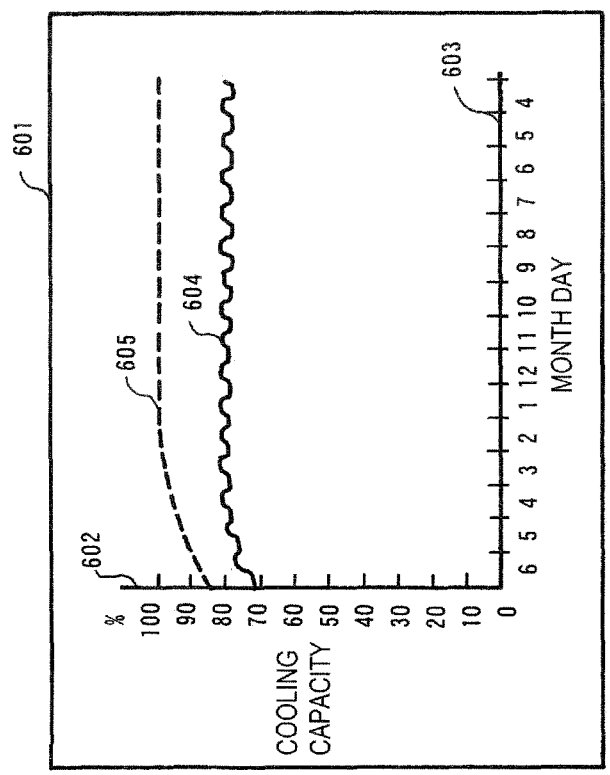
FIG. 8 is an explanatory diagram showing an image display sample of a cooling capacity of a cryocooler.

FIG. 8 is an example of the screen 601 that shows control information about the GM cycle control unit 301 and the refrigerant gas pressure control unit 501. The screen 601 is displayed on the display 119. The graph 601 shows a value (a relative value when the rated cooling capacity is 100%) of a cryocooler cooling capacity obtained from the number of a GM cycle or refrigerant gas pressure on the vertical axis 602 and a date on the horizontal axis 603. The latest value is displayed on the left, and the cooling capacity change 604 of a cryocooler that is currently incorporated is displayed. Hence, an operator and service person of an MRI apparatus can check operation states of a superconducting magnet and a cryocooler as well as time-dependent deterioration or failure severity of the cooling capacity. Hence, whether an MRI apparatus is normal or not and when the next maintenance is can be also judged exactly.

In addition, the graph 605 that shows changes of a standard cooling capacity of a cryocooler is superimposed to easily check if the lifetime of a currently used cryocooler is extended longer than that of a standard cooling capacity and an operating state by comparing the graph 605 with the graph 604.

REFERENCE SIGNS LIST

101: superconducting magnet
102: object
107: cold head
108: compressor unit
110: magnet control unit
201: vacuum vessel
202: helium vessel
203: superconducting coil
204: liquid helium
206: pressure sensor
216: radiation shield plate
219: first cooling stage
220: second cooling stage
301: GM cycle control unit
302: displacer driving unit
303: displacer
304: cylinder
501: refrigerant gas pressure control unit

The invention claimed is:

1. A magnetic resonance imaging apparatus, comprising:
a superconducting magnet that generates a static magnetic field in an imaging space;
a gradient magnetic field coil that applies a gradient magnetic field to the imaging space;
a high-frequency coil that applies a high-frequency magnetic field to the imaging space; and
a control unit that controls operations of the gradient magnetic field coil and the high-frequency coil to execute a predetermined imaging sequence,
wherein the superconducting magnet includes a refrigerant vessel to accommodate a refrigerant and a superconducting coil, a cooler that is connected to the refrigerant vessel and re-condenses refrigerant gas vaporized in the refrigerant vessel, and a detector to detect pressure in the refrigerant vessel,
wherein the cooler includes a cylinder, a displacer disposed in the cylinder, a driving unit that reciprocates the displacer in the cylinder, and a compressor unit that supplies the cylinder with compressed refrigerant gas, and
wherein
the control unit controls a cooling capacity of the cooler of the superconducting magnet by controlling a frequency of reciprocation of the displacer, and
the control unit compares a pressure value detected by the detector with a predetermined set pressure value and continuously performs feedback control that increases the cooling capacity of the cooler if the pressure value is higher than the set pressure value and that reduces the cooling capacity of the cooler if the pressure value is lower than the set pressure value to maintain a thermal equilibrium state at the set pressure value.

2. The magnetic resonance imaging apparatus according to claim 1, wherein
there are a plurality of types of imaging sequences, and
the control unit estimates a cooling capacity that should be increased for the cooler based on the amount of heat penetrating into the refrigerant vessel by the gradient magnetic field and high-frequency magnetic field when the imaging sequence is executed after the heat amount is calculated for each type amongst the plurality of types of imaging sequences in advance and increases a cooling capacity of the cooler continuously to the estimated cooling capacity.

3. The magnetic resonance imaging apparatus according to claim 1, further includes a magnetic field adjustment unit that adjusts at least one of magnetic field strength or magnetic field homogeneity, in the imaging space, and
wherein the magnetic field adjustment unit compensates change amounts of magnetic field strength and magnetic field homogeneity in the imaging space due to a pressure change in the refrigerant vessel.

4. The magnetic resonance imaging apparatus according to claim 2, wherein the control unit performs feedback control that maintains pressure in the refrigerant vessel to predetermined set pressure even in a state where an imaging sequence is not executed.

5. The magnetic resonance imaging apparatus according to claim 1, wherein the control unit displays information that shows (i) a change over time of a cooling capacity of the cooler along with (ii) changes over time of a standard cooling capacity on an image display device.

6. A magnetic resonance imaging apparatus, comprising:
a superconducting magnet that generates a static magnetic field in an imaging space;
a gradient magnetic field coil that applies a gradient magnetic field to the imaging space;
a high-frequency coil that applies a high-frequency magnetic field to the imaging space; and
a control unit that controls operations of the gradient magnetic field coil and the high-frequency coil to execute a predetermined imaging sequence,
wherein the superconducting magnet includes a refrigerant vessel to accommodate a refrigerant and a superconducting coil, a cooler that is connected to the refrigerant vessel and re-condenses refrigerant gas vaporized in the refrigerant vessel, and a detector to detect pressure in the refrigerant vessel,
wherein the cooler includes a cylinder, a displacer disposed in the cylinder, a driving unit that reciprocates the displacer in the cylinder, and a compressor unit that supplies the cylinder with compressed refrigerant gas,
wherein the control unit controls a cooling capacity of the cooler of the superconducting magnet by controlling a frequency of reciprocation of the displacer, and the control unit compares a pressure value detected by the detector with a predetermined set pressure value and continuously performs feedback control that increases the cooling capacity of the cooler if the pressure value is higher than the set pressure value and that reduces the cooling capacity of the cooler if the pressure value is lower than the set pressure value to maintain a thermal equilibrium state at the set pressure value, and
wherein the control unit controls the frequency of reciprocation of the displacer based on the pressure value detected by the detector, compared to the predetermined set pressure value, including increasing the frequency of reciprocation of the displacer if the pressure value is higher than the set pressure value and reducing the frequency of reciprocation of the displacer if the pressure value is lower than the set pressure value.

* * * * *